United States Patent
Heppner et al.

(10) Patent No.: US 10,193,493 B2
(45) Date of Patent: Jan. 29, 2019

(54) MULTI-SURFACE SOLAR CELL PACKAGING FOR SELF-POWERED ELECTRONIC DEVICES

(71) Applicant: Intel Corporation, Santa Clara, CA (US)

(72) Inventors: Joshua Heppner, Chandler, AZ (US); Debendra Mallik, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 83 days.

(21) Appl. No.: 15/270,787

(22) Filed: Sep. 20, 2016

(65) Prior Publication Data

US 2018/0083569 A1    Mar. 22, 2018

(51) Int. Cl.

| | |
|---|---|
| *H02S 30/20* | (2014.01) |
| *H02S 40/36* | (2014.01) |
| *H02S 40/38* | (2014.01) |
| *H05K 1/18* | (2006.01) |
| *H05K 1/02* | (2006.01) |
| *H02J 7/35* | (2006.01) |

(52) U.S. Cl.
CPC .............. *H02S 30/20* (2014.12); *H02J 7/355* (2013.01); *H02S 40/36* (2014.12); *H02S 40/38* (2014.12); *H05K 1/028* (2013.01); *H05K 1/181* (2013.01); *H05K 2201/10143* (2013.01)

(58) Field of Classification Search
CPC .......... H02S 30/20; H02S 40/36; H02S 40/38; H05K 2201/10143; H05K 1/028; H05K 1/181; H02J 7/355

USPC .................. 136/243–265; 62/235.1
See application file for complete search history.

(56) References Cited

U.S. PATENT DOCUMENTS

| | | | |
|---|---|---|---|
| 5,522,943 A | 6/1996 | Spencer et al. | |
| 5,969,501 A * | 10/1999 | Glidden | .................. F24J 2/523 |
| | | | 320/101 |
| 6,380,477 B1 | 4/2002 | Curtin | |
| 9,080,736 B1 * | 7/2015 | Salzinger | ........... H05B 37/0218 |
| 9,640,692 B2 | 5/2017 | Armstrong et al. | |
| 2009/0025411 A1 | 1/2009 | Anderson | |
| 2009/0038673 A1 * | 2/2009 | Ware | ....................... H02S 40/38 |
| | | | 136/246 |
| 2011/0204843 A1 | 8/2011 | Foster | |
| 2015/0043147 A1 | 2/2015 | Johnson et al. | |
| 2015/0068582 A1 | 3/2015 | Chaney | |
| 2015/0083191 A1 * | 3/2015 | Gmundner | ........... H01L 31/048 |
| | | | 136/245 |

(Continued)

OTHER PUBLICATIONS

International Search Report and Written Opinion for PCT Patent Application No. PCT/US2017/047962, dated Nov. 28, 2017, 13 pages.

(Continued)

*Primary Examiner* — Steven T Sawyer
(74) *Attorney, Agent, or Firm* — Compass IP Law PC

(57) ABSTRACT

A solar cell assembly includes a bendable substrate and multiple solar cells to be mounted over different surfaces of an electronic device. The bendable substrate includes an electrical contact to couple to an electrical contact on one of the surfaces of the electronic device. Thus, the electronic device only needs an electrical connection on one surface, and the solar cell assembly can mount solar cells on multiple surfaces to couple to the one electrical connection.

23 Claims, 11 Drawing Sheets

(56) References Cited

U.S. PATENT DOCUMENTS

| | | |
|---|---|---|
| 2015/0277498 A1 | 10/2015 | Wu et al. |
| 2016/0147263 A1 | 5/2016 | Choi et al. |
| 2017/0163212 A1 | 6/2017 | France et al. |
| 2017/0263787 A1 | 9/2017 | de la Fuente Vornbrock et al. |

OTHER PUBLICATIONS

Jiwu Lu, Solar Cells on CMOS Chips As Energy Harvesters—Integration and CMOS Compatibility, 2011, 125 pages.

* cited by examiner

MULTI-SURFACE SOLAR CELL PACKAGING FOR SELF-POWERED ELECTRONIC DEVICES

FIELD

Descriptions are generally related to solar power, and more particular descriptions are related to solar cell packaging for solar cells mounted on self-powered electronics.

COPYRIGHT NOTICE/PERMISSION

Portions of the disclosure of this patent document may contain material that is subject to copyright protection. The copyright owner has no objection to the reproduction by anyone of the patent document or the patent disclosure as it appears in the Patent and Trademark Office patent file or records, but otherwise reserves all copyright rights whatsoever. The copyright notice applies to all data as described below, and in the accompanying drawings hereto, as well as to any software described below: Copyright © 2016, Intel Corporation, All Rights Reserved.

BACKGROUND

There are many benefits to using solar power. Solar power has long been used to power small electronic devices such as calculators. However, electronic devices with processors and sensors consume greater power, and are frequently packaged in much smaller packages. Thus, the available surface area on a surface of an electronic device may be insufficient to provide enough solar power to keeping the device running. Larger and smaller devices may benefit from more solar power than can be collected from a solar cell mounted on its surface, especially when considering that solar efficiency drops significantly with the angle of the solar radiation reaching the device. However, trying to mount solar cells on multiple surfaces presents many cost and manufacturability concerns.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, and/or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Descriptions of certain details and implementations follow, including a description of the figures, which may depict some or all of the embodiments described below, as well as discussing other potential embodiments or implementations of the inventive concepts presented herein.

DETAILED DESCRIPTION

As described herein, a solar cell assembly includes a flexible substrate and multiple solar cells to be mounted over different surfaces of an electronic device. The flexible substrate includes an electrical contact to couple to an electrical contact on one of the surfaces of the electronic device. Thus, the electronic device only needs an electrical connection on one surface, and the solar cell assembly can mount solar cells on multiple surfaces to couple to the one electrical connection.

Such a solar cell assembly enables more uses of solar power. For devices that can have enough surface area on their packages to enable the use of solar power, such an assembly can extend the use and capacity of solar power. For devices that are currently too small to have enough surface area on one surface to enable the use of solar power, a solar power system can be employed. Additionally, for a device that is exposed to light at different angles of incidence over the course of a day or time period that previously had limited solar capability due to poor light exposure, such an assembly can enable extended use of solar power.

As an example of a small system that can be enabled for use of solar energy, consider a system in package (SIP) or other module that includes a microprocessor or other processor, and one or more sensors. Such a device can include motes, referring to small sensor and microprocessor devices. SIP devices can be made very small with system packaging that lacks sufficient surface area per side to make solar power functional. As described herein, such a system can be self-powered using solar energy either alone or in combination with other power delivery techniques. Such a solar assembly can enable the use of solar energy on a device too small for a solar application with traditional solar systems. Additionally, such an assembly can enable better or more efficient solar by utilizing more than one surface of the electronic device.

Figure 1:
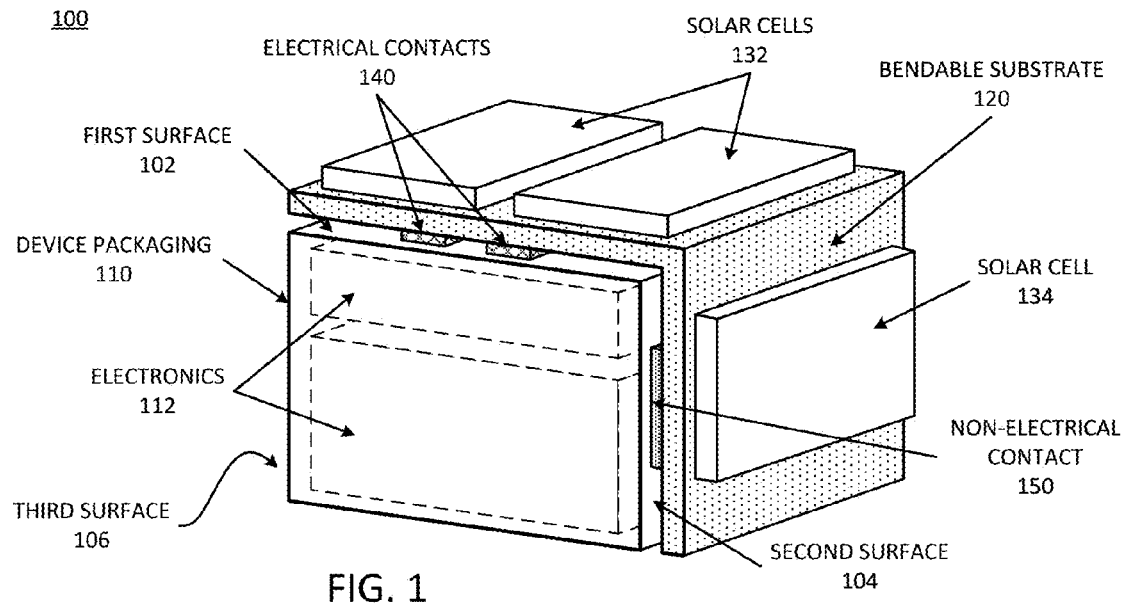
FIG. 1 is a representation of an embodiment of a perspective view of an electronic device with a multi-surface solar package.

FIG. 1 is a representation of an embodiment of a perspective view of an electronic device with a multi-surface solar package. System 100 illustrates an electronic device that includes device packaging 110, on which is mounted bendable substrate 120 to provide solar power. In one embodiment, the entirety of system 100 can be considered the electronic device, with both device packaging 110 and the solar assembly of bendable substrate 120. In one embodiment, device packaging 110 represents the electronic device, and bendable substrate 120 is considered to be mounted on the electronic device.

In one embodiment, device packaging 110 houses electronics 112, which can include a microcontroller or microprocessor or other processing device. In one embodiment, electronics 112 include one or more sensor devices. A sensor represents a device that gathers data about an environment in which system 100 is located. There are innumerable examples of sensors, which can gather environmental data, movement data, data about operation of another device, or other forms of data. Bendable substrate 120 allows the mounting of solar cells on device packaging 110 to provide solar power for electronics 112.

Bendable substrate 120 is referred to as "bendable" because it can be folded or bent at an angle as opposed to remaining flat or in a plane. In one embodiment, substrate 120 can be folded completely over, or nearly completely over, where one surface of the substrate is put into contact or nearly in contact with itself. To the extent that a difference may be drawn between the expressions bendable and foldable, as used herein, foldable can refer to a more flexible substrate that can be folded to extreme angles, and potentially folded on itself. In one embodiment, the expression bendable can refer to a substrate that may be flexible enough to permit bending the substrate, but perhaps to less extreme angles than what might be considered foldable. In descriptions herein, a substrate may be referred to as being bent or folded, but should not be understood as limiting.

The descriptions contemplate that a flexible substrate can be used to permit mounting of the substrate to multiple different surfaces of an electronic device. In one embodiment, at least one surface of the device intersects with at least one other surface to form a 90 degree angle, similar to what is illustrated in system 100. In one embodiment, at least two surfaces of a device intersect at an angle of 45 degrees, or some other angle. With a bendable substrate 120, various shapes of devices packaging 110 may be contemplated to permit mounting to multiple different surfaces or facets of an electronic device. A simple case is illustrated in system 100 simply for convenience in description.

It will be understood that solar cells could be mounted on multiple electronic device surfaces with traditional processing. However, such techniques would require the use of complex and expensive processing. With substrate 120, a manufacturer could process a solar assembly on the substrate with "flat processing", or planar processing techniques, and then bend the resulting assembly around device packaging 110. Bending substrate 120 around device packaging permits the simpler processing of the solar components, but the mounting of the solar assembly to multiple device surfaces to improve the conversion of light to energy by increasing solar energy surface area per device volume, and improving response to different solar incidence angles.

Substrate 120 couples to device packaging 110 or to the electronic device via an electrical connection to provide the solar energy to power electronics 112. Electrical contacts 140 represent the electrical connection to the device. In one embodiment, electrical contacts 140 include at least two contacts, a power and ground line. Reference may be made herein to an electrical contact or electrical connection in the singular, without specifying the number of contacts, which may be used solely for convenience in description. Electrical contacts 140 can be or include pads, pins, balls, or other mechanism that provides an electrical coupling.

In one embodiment, substrate 120 couples to one surface via electrical contacts 140 and one or more non-electrical mechanisms, such as an adhesive. In one embodiment, substrate 120 couples to a different surface only via non-electrical contact 150, where the side of the non-electrical connection lacks an electrical connection. The lacking of an electrical connection can be by design of the system (e.g., there are no electrical connection points on that side or surface). Alternatively, the lacking of the electrical connection can be as a practical matter, such as when an electrical connection is present and not used. However, it will be understood that it tends to be simpler for processing, and less expensive to simply exclude an electrical connection where it is not needed. Non-electrical contact 150 can be or include an adhesive, which can be any type of adhesive. An adhesive will commonly "cure" to set the adhesion. Non-electrical contact 150 couples substrate 120 to the side of device packaging 110.

As illustrated, substrate 120 enables the mounting of solar cells over multiple surfaces of device packaging 110. For purposes of description, and not by way of limitation, system 100 will now be described with reference to an orientation of the page as illustrated, with a "top" surface, and a "side" surface. Substrate 120 enables the mounting of one or more solar cells 132 over the top surface, and the mounting of one or more solar cells 134 over the side surface. System 100 is specifically illustrated with two solar cells 132, and one solar cell 134. System 100 illustrates that different numbers of solar cells can be mounted over different surfaces of the electronic device. Alternatively, all surfaces where solar cells are mounted can have the same number of solar cells.

Descriptions herein may refer to solar cells being mounted over a surface or on a surface. It will be understood that the solar cells are directly mounted on substrate 120, and the substrate is then mounted on or over a surface of the electrical device. Substrate 120 can be thought of being separated into various portions, as delineated by the bends in substrate 120. A portion of the substrate may include one or more solar cells. Again, different portions can have different numbers of solar cells. The solar cells in the various portions may be referred to as being on or over the surface to which the portion of substrate to which they belong is mounted. For example, solar cell 134 can be said to be mounted on the side surface of device packaging 110, even though it will be understood that solar cell 134 does not directly contact device packaging 110.

With solar cells 132 on the top surface, and solar cell 134 on the side surface, system 100 provides solar on multiple surface of device packaging 110. With solar on multiple device surfaces, system 100 increases the total harvestable solar energy for a given device volume of device packaging 110. Thus, system 100 is scalable to smaller and larger devices. As such, system 109 can provide solar power for very small, self-powered devices such as motes. When a solar cell faces the sun directly (i.e., angle of incidence of 90 degrees), the harvested solar energy can be maximized. Most small, low cost electronic devices, are likely to be at fixed orientation, which causes the incidence angle of the sun rays to change over the course of the day and over different seasons of the year. As provided in system 100 with solar cells 132 and 134 on multiple surfaces of the device, system 100 increases the total solar cell surface area, which increases the total energy potential. Not only does system 100 increase the total solar cell surface area, system 100 makes the harvested energy more uniform throughout the day and throughout the year as compared to a solar cell on a single device surface.

System 100 provides one example of surface designations, which is intended as a possible illustration, and is not limiting. Device packaging 110 includes multiple surfaces, which can include first surface 102, second surface 104, and third surface 106. Third surface 106 is understood to be "behind" the perspective view of system 100, or to be in the back of what is illustrated. In one embodiment, first surface 102 represents a surface that includes electrical contacts 140. In one embodiment, second surface 104 and third surface 106 do not include electrical contacts, but can connect a solar surface or a solar unit with non-electrical contact 150. In an alternative embodiment, what is labeled as second surface 104 can be the first surface with electrical contacts, and what is labeled as first surface 102 can be the second surface without electrical contacts. Third surface 106 would then extend off of second surface 104 that lacks electrical contacts, instead of both the second and third surfaces extending off the first surface with the electrical contacts. While system 100 illustrates two surfaces with solar units, it will be understood that a device can include more than two surfaces with solar units (such as three, four, or five).

Figure 2:
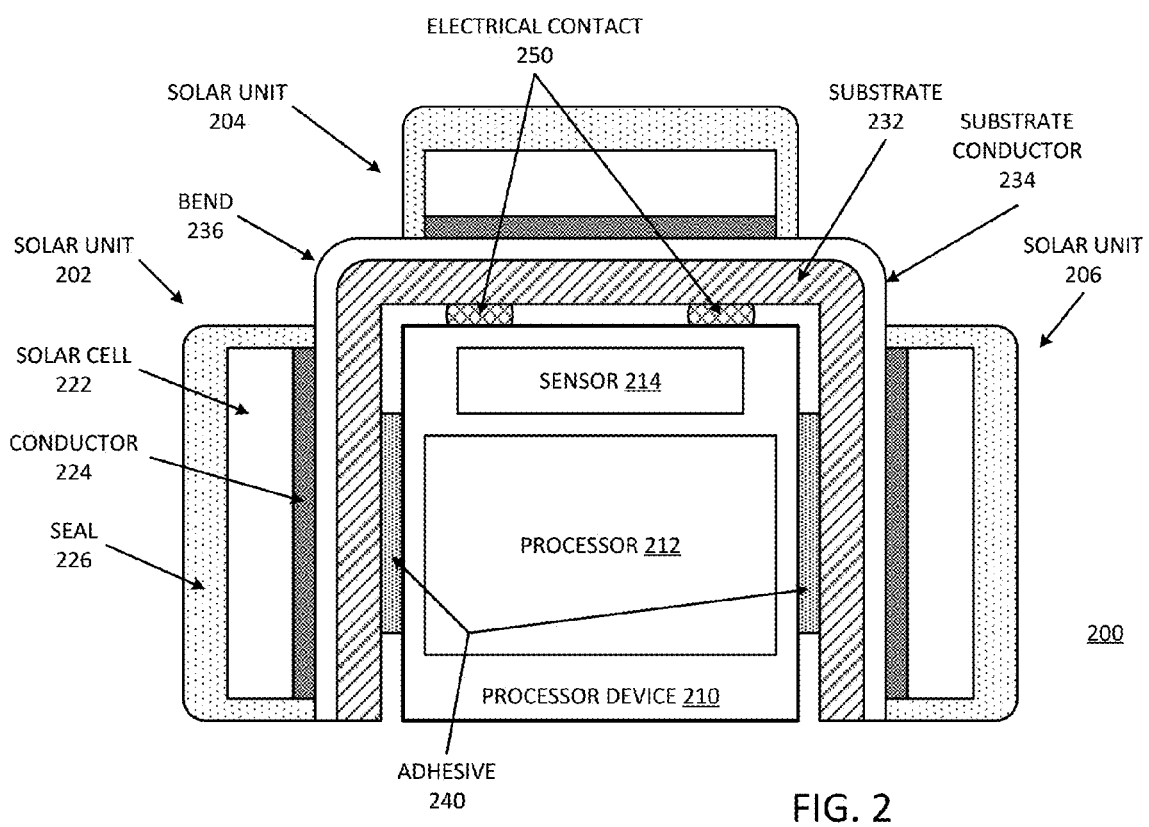
FIG. 2 is a representation of an embodiment of a cross section view of an electronic device with a multi-surface solar package with multiple portions that lack electrical contacts to the electronic device.

FIG. 2 is a representation of an embodiment of a cross section view of an electronic device with a multi-surface solar package with multiple portions that lack electrical contacts to the electronic device. System 200 includes a primary electronic device and a solar assembly. Processor device 210 represents the primary electronic device. System 200 provides an example of a system in accordance with system 100 of FIG. 1, with solar units specifically illustrated on three surfaces of processor device 210.

In one embodiment, processor device 210 includes one or more processors 212, and one or more sensors 214. Other components are possible. The components other than those in processor device 210 represent an example of a solar assembly. The solar assembly illustrated in system 200 includes three solar units, 202, 204, and 206. A solar unit can refer to one or more solar cells mounted together on a substrate as a portion of a solar assembly to be mounted over a surface of the electronic device.

The solar assembly includes substrate 232, which is a flexible substrate capable of being bent while still conducting one or more electrical signals. Substrate conductor 234 represents a layer of one or more conductors on substrate 232. Bend 236 illustrates a bend of 90 degrees or approximately 90 degrees. Substrate conductor 234 conducts an electrical signal, such as solar power from the solar units, even over or through bend 236.

In one embodiment, the bendable solar cell package of substrate 232, substrate conductor 234, and solar units 202, 204, and 206 allows the solar cells to be connected to the main electronic device (processor device 210) through interconnect terminals placed only on one of its surfaces. Electrical contact 250 represents the electrical contact, and can be or include, for example, solder, conductive paste or other conductive adhesive, or other electrical connection. It will be understood that what appears to be a gap between substrate 232 and processor device 210 is simply for convenience in illustration to show electrical contact 250 and adhesive 240. In a practical implementation, substrate 232 may directly contact in whole or in part to the outer surfaces of processor device 210.

System 200 provides labels to describe solar unit 202; for convenience, solar units 204 and 206 are not labeled, but can be understood to be the same or similar to solar unit 202. Solar unit 202 includes one or more solar cells 222 mounted to substrate 232 or to one or more substrate conductors 234 via conductor 224. Conductor 224 provides an electrical connection from solar cell 222 to substrate conductor 234. For purposes of description, and not by way of limitation, solar unit 202 will be described as being mounted on a left surface or left side of processor device 210, solar unit 204 will be described as being mounted on a top surface, and solar unit 206 will be described as being mounted on a right surface. The designations are arbitrary. Solar unit 202 is mounted to the left surface by virtue of being mounted to via adhesive 240, and solar unit 206 is mounted to the right surface via adhesive 240. In both cases, the surfaces can lack electrical contacts. The top surface includes electrical contacts, and permits electrical connection of the entire solar assembly to processor device 210.

In one embodiment, substrate 232 electrically couples to processor device 210 via connectors on the edge of the solar assembly package. The solar assembly enables a single electronic device design which allows for the selection of a number of different device surfaces to be used for solar cells with different locations for bend 236. Alternatively to referring to the angle in substrate 232 as a "bend," it can be referred to as a hinge or fold. The location of one or more bends can provide for mounting different solar units on different surfaces of the electronic device. As described in more detail below, the solar cells within a single solar unit, or between different solar units, or both, can be connected in series (for higher voltage) or in parallel (for higher current). The implementation of series or parallel connections can be implemented by changes in substrate conductor 234, with different substrate interconnection patterns. Such changes would not affect the design of the packaging or internal components of processor device 210.

System 200 provides an example of a system in which an electronic device includes multiple surfaces that intersect at an angle. The system includes a solar assembly that mounts to multiple surfaces of the electronic device, to mount solar units over or position them over different surfaces of the electronic device. In one embodiment, the solar assembly electrically connects to processor device 210 on the top surface. It will be understood that the solar assembly could electrically connect to one of the other surfaces instead of the top surface. For example, the left surface of processor device 210 could include electrical contacts to connect to substrate 232, and substrate 232 can connect to both the top and right surfaces via adhesive 240, without connecting electrically.

System 100 of FIG. 1, and system 200 of FIG. 2 provide examples of solar cells being mounted on a flexible substrate. In one embodiment, in either or both of those figures, and in embodiments of other drawings discussed below, solar cell dies or solar cell packages can be mounted directly on a flexible substrate. A solar cell die refers to the die itself, and a solar cell die package can refer to a solar unit, with a die attached to a substrate, which can include wirebonding and wirebond encapsulation or other interconnections or a combination. Alternatively to mounting directly on a flexible substrate, the solar cell die can be prepared as a pre-packaged unit, and then the unit can be attached (e.g., soldered) to a flexible substrate. The flexible substrate can then be electrically mounted to a surface of a device, and mechanically mounted to one or more additional surfaces.

Figure 3:
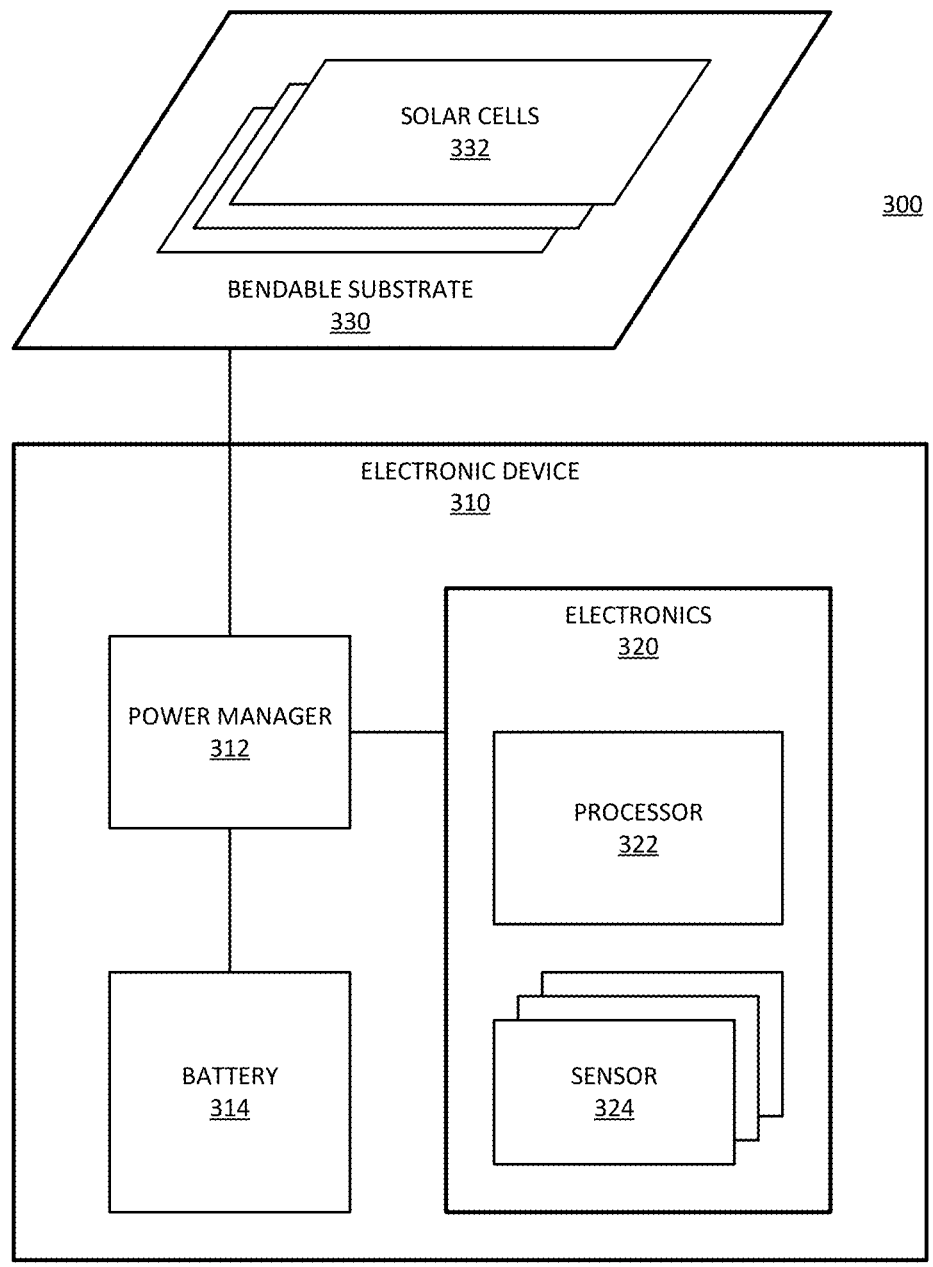
FIG. 3 is a block diagram of an embodiment of a system with solar cells on a bendable substrate.

FIG. 3 is a block diagram of an embodiment of a system with solar cells on a bendable substrate. System 300 provides one example of a system in accordance with system 100 of FIG. 1, or system 200 of FIG. 2. Whereas systems 100 and 200 provide representations of a physical layout of a system, system 300 illustrates the components of such an electronic device. It will be understood that the physical representations provided or a different physical layout could be applied to system 300. While the packaging of electronic device 310 is not specifically illustrated, it will be understood that electronic device 310 includes a housing or packaging to house the illustrated components.

System 300 includes electronic device 310, including electronics 320. In one embodiment, electronic device 310 is an SIP. Electronics 320 can include one or more processors 322 and one or more sensors 324. Electronics 320 can include memory or storage elements (not specifically shown) to store data for processing by processor 322 and to store data processed by processor 322. Such memory can also store data generated by sensors 324. Processor 322 can be or include a microprocessor, microcontroller, central processing unit, application specific processor, logic array, digital signal processor, or other processor.

In one embodiment, electronic device 310 includes power manager 312 to provide power to electronics 320. Power manager 312 can include one or more voltage source or regulator components. In one embodiment, power manager 312 includes control logic to implement a power management strategy. In one embodiment, electronic device 310 includes battery 314, which stores power for use by electronics 320. In one embodiment, power manager 312 controls use of battery power. In one embodiment, power manager 312 charges battery 314 with solar power. In one embodiment, power manager 312 powers electronics 320 directly from solar power. In one embodiment, power manager 312 powers electronics 320 indirectly via charging battery 314 to provide power to the electronics.

Figure 4A:
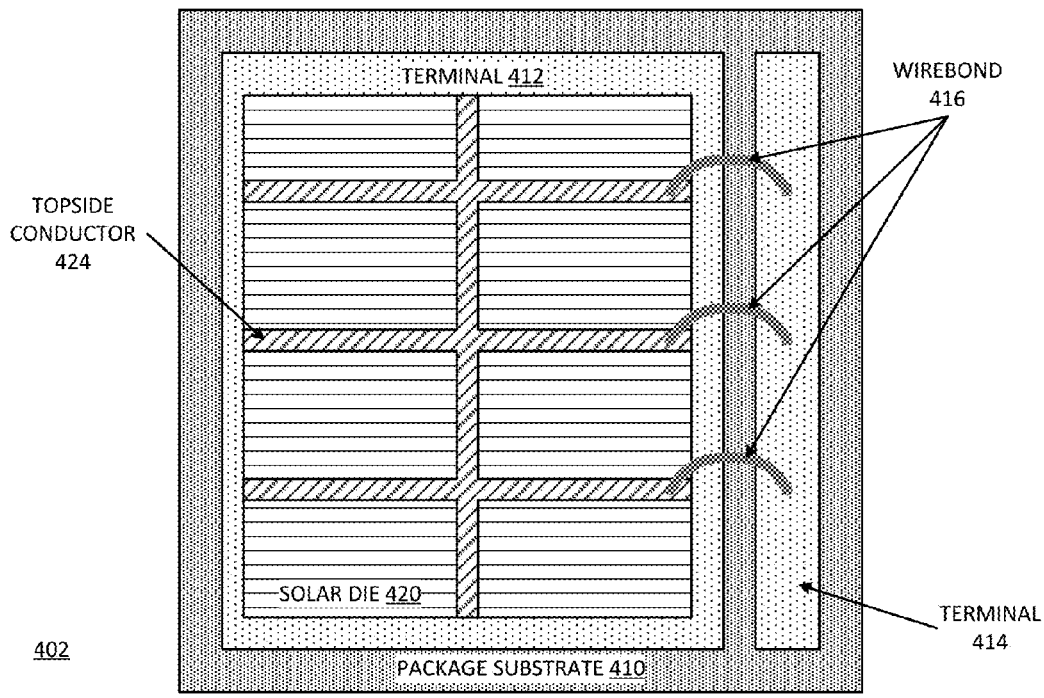
FIGS. 4A-4B are representations of an embodiment of a top view and side view, respectively, of a solar cell package.
Figure 4B:
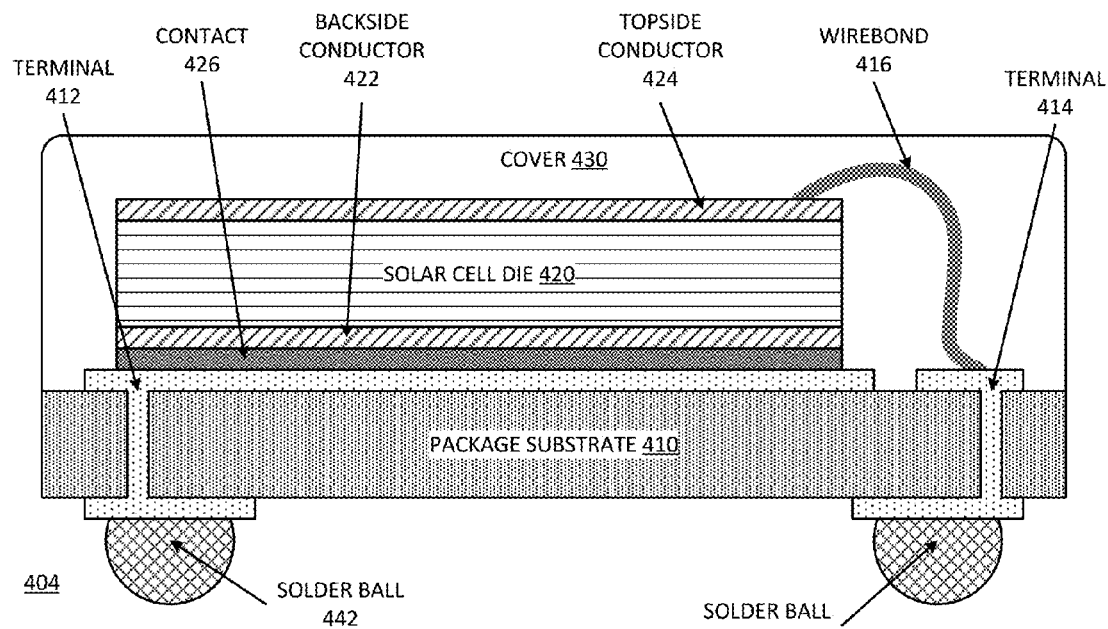

FIGS. 4A-4B are representations of an embodiment of a top view and a side view, respectively, of a solar cell package. View 402 of FIG. 4A provides a "top" view looking down onto one example of a solar unit. View 404 of FIG. 4B provides a cross section view looking at the "side" of the example of the solar unit. For simplicity, certain components are omitted from view 402.

Package substrate 410 illustrates a portion of substrate on which solar die 420 is mounted. In one embodiment, solar die 420 is mounted on terminal 412, which provides an electrical connection to solder ball 442 or other electrical connection. The terminal enables the connection of package substrate to a device surface. It will be understood that with terminal 412 and terminal 414 passing through substrate 410, it will be understood that the solar unit illustrated will be electrically coupled to the electronic device for which it will provide solar power. As described herein, there may be other solar units that connect via traces or connectors on a surface of substrate 410 on which the solar die is mounted, and do not include terminals that extend through substrate 410 to electrically connect to the electronic device.

In one embodiment, solar die 420 includes topside conductors 424, which can be in accordance with the pattern illustrated, or a different pattern. Topside conductor 424 provides electrical signals that enable the operation of solar die 420. Topside conductor 424 couples to terminal 414. In one embodiment, topside conductor 424 couples to terminal 414 via a wirebond connection. Wirebonds 416 represent thin electrical wires that can be processed with one end making electrical contact to conductor 424 and the other end making electrical contact with terminal 414. In one embodiment, solar die 420 is mounted to terminal 412 via one or more backside conductor 422 via contacts 426. In one embodiment, solar die 420 can be soldered or otherwise processed onto terminal 412 and thus onto substrate 410 via known techniques.

There are solar panels available that include solderable contacts, such as large panels. In one embodiment, processing can include cutting such a large panel into pieces, and mount smaller pieces to a flexible substrate. As such, a solar assembly can be produced that includes multiple different solar dies on a flexible substrate to be mounted to multiple different surfaces of an electronic device. While not limiting, examples of die size can include 5 mm×5 mm, 5 mm×10 mm, 10 mm×10 mm, or any other size whether square or rectangular.

The processing of a solar cell assembly with separate solar chips or solar dies mounted to a flexible substrate can enable high volume manufacturing of solar components for mounting on an electronic device. In one embodiment, the manufacturing of the assembly illustrated in views 402 and 404 can include the application of wirebonding techniques, printing or dispensing a conductive die attach film or paste or ink, the application of lamination or glob top materials, or other techniques. Briefly, a solar assembly can be created with processes typical of microelectronics packaging. In one embodiment, the solar unit of the solar cell assembly is covered with cover 430, which can represent a clear or optically transparent cover to protect the electrical components of the solar cell assembly.

Figure 5:
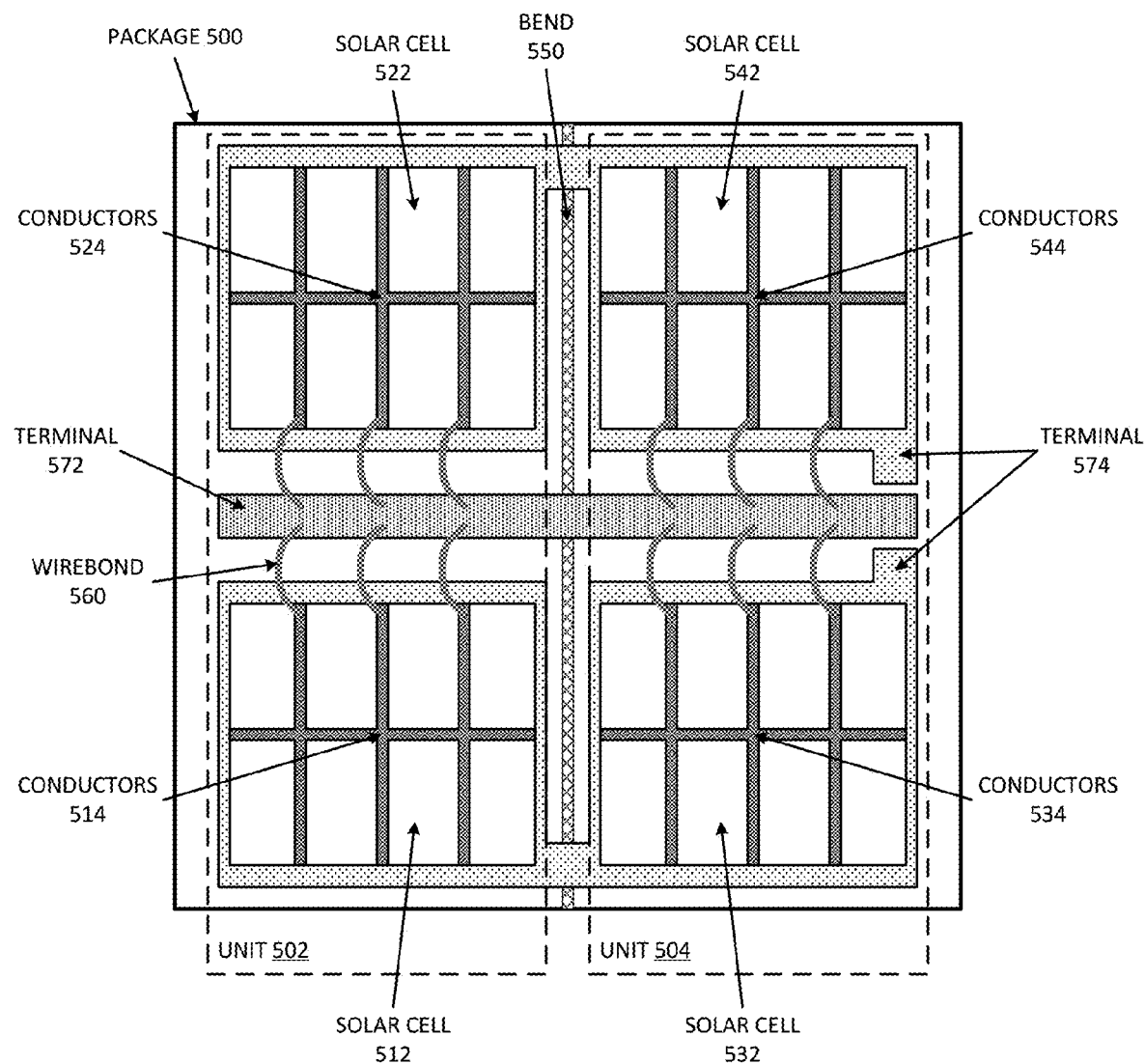
FIG. 5 is a representation of an embodiment of a top view of a solar cell package with multiple cells per unit.

FIG. 5 is a representation of an embodiment of a top view of a solar cell package with multiple cells per unit. In one embodiment, solar cell assembly package 500 includes two solar cell units, as illustrated by the dashed lines of unit 502 and unit 504. A unit can include one or more solar cells that are mounted over the same surface of an electronic device. Units 502 and 504 are illustrated to include two solar dies each, where each solar die represents a solar cell. It will be understood that a solar die can include multiple solar cells, and what is illustrated is a non-limiting example. Additionally or alternatively, units 502 and 504 can include only a single solar cell per unit, or can include more than two solar cells per unit. Units 502 and 504 as illustrated both include the same number of solar cells, but they can alternatively have a different number of cells per unit; thus, not every unit will necessarily include the same number of solar cells. Units of solar cells can be separated by a bend or fold in the substrate. As illustrated, package 500 includes solar cells coupled in parallel, but it will be understood that a series implementation could alternatively be used. Alternatively, some solar cells could be coupled in parallel while other are connected in series, in any combination. As one example, solar cells within a unit could be coupled in series, and units can be coupled in parallel.

In one embodiment, package 500 includes unit 502, including solar cell 512 with conductors 514 and solar cell 522 with conductors 524. Conductors 514 and 524 couple to terminal 572 via wirebonds 560. In one embodiment, package 500 includes unit 504, including solar cell 532 with conductors 534 and solar cell 542 with conductors 544. Conductors 534 and 544 couple to terminal 572 via wirebonds 560. Solar cells 512, 522, 532, and 542 also couple to each other via backside conductors (not explicitly shown) to terminal 574. For purposes of illustration, terminal 572 is illustrated with gaps from terminal 572 to illustrate that terminal 574 does not electrically connect to terminal 572 (which would short out the solar cells). However, terminal 572 connects to all solar cells 512, 522, 532, and 542, and the gap illustrates that the terminal is connected on another layer from terminal 572. Terminal 574 may extend below or above terminal 572 to make the connection.

Bend 550 illustrates a separation of the multiple solar cells of package 500. In an implementation involving package 500, unit 502 would be mounted over one surface of an electronic device, and unit 504 would be mounted over a different surface of the electronic device. Multi-cell units can be used with any embodiment of a solar assembly described herein.

Figure 6:
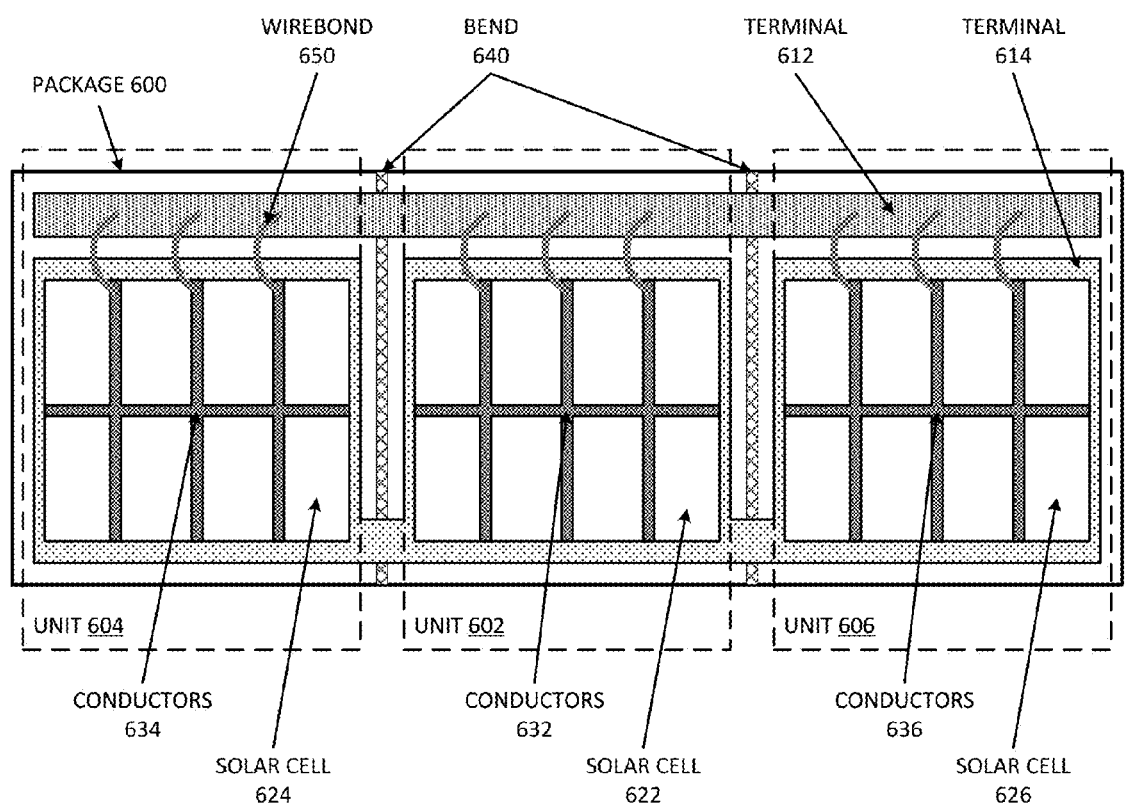
FIG. 6 is a representation of an embodiment of a top view of a three-unit solar cell package.

FIG. 6 is a representation of an embodiment of a top view of a three-unit solar cell package. Package 600 provides an example of a solar cell assembly with three portions or regions or segments, to be mounted on three different surfaces of an electronic device, such as the first, second, and third surfaces of the device of system 100. In one embodiment, package 600 includes units 602, 604, and 606. As illustrated, unit 602 includes solar cell 622 with conductors 632, unit 604 includes solar cell 624 with conductors 634, and unit 606 includes solar cell 626 with conductors 636. While shown with a single solar cell per unit, in one embodiment, one or more unit 602, 604, or 606 includes multiple solar cells. As illustrates, the solar cells are coupled in parallel, but could be coupled series.

In one embodiment, solar cells 622, 624, and 626 couple to terminal 612 via wirebonds 650. In one embodiment, terminal 614 couples under the solar cells. Unit 602 is separated from units 604 and 606 via bends 640. In one embodiment, unit 602 will mount to a top of an electronic device, and units 604 and 606 will be mounted over sides of the electronic device, by bending the units down at angles to match the substrate to the surfaces of the electronic device. In one embodiment, electrical contacts for package 600 will be under unit 602. In one embodiment, electrical contacts for package 600 will be under unit 604. In one embodiment, electrical contacts for package 600 will be under unit 606.

Package 600 includes a bendable substrate that enables the mounting of the solar cell units to an electronic device. In one embodiment, terminal 614 includes sections of conductor, and include a trace or segment of conductor to couple the conductors under the solar cells to each other. The traces or conductors on the substrate can bend as the substrate, and still provide electrical contact. Thus, even when bent, package 600 provides electrical paths to transfer solar power generated by the solar cells.

Figure 7:
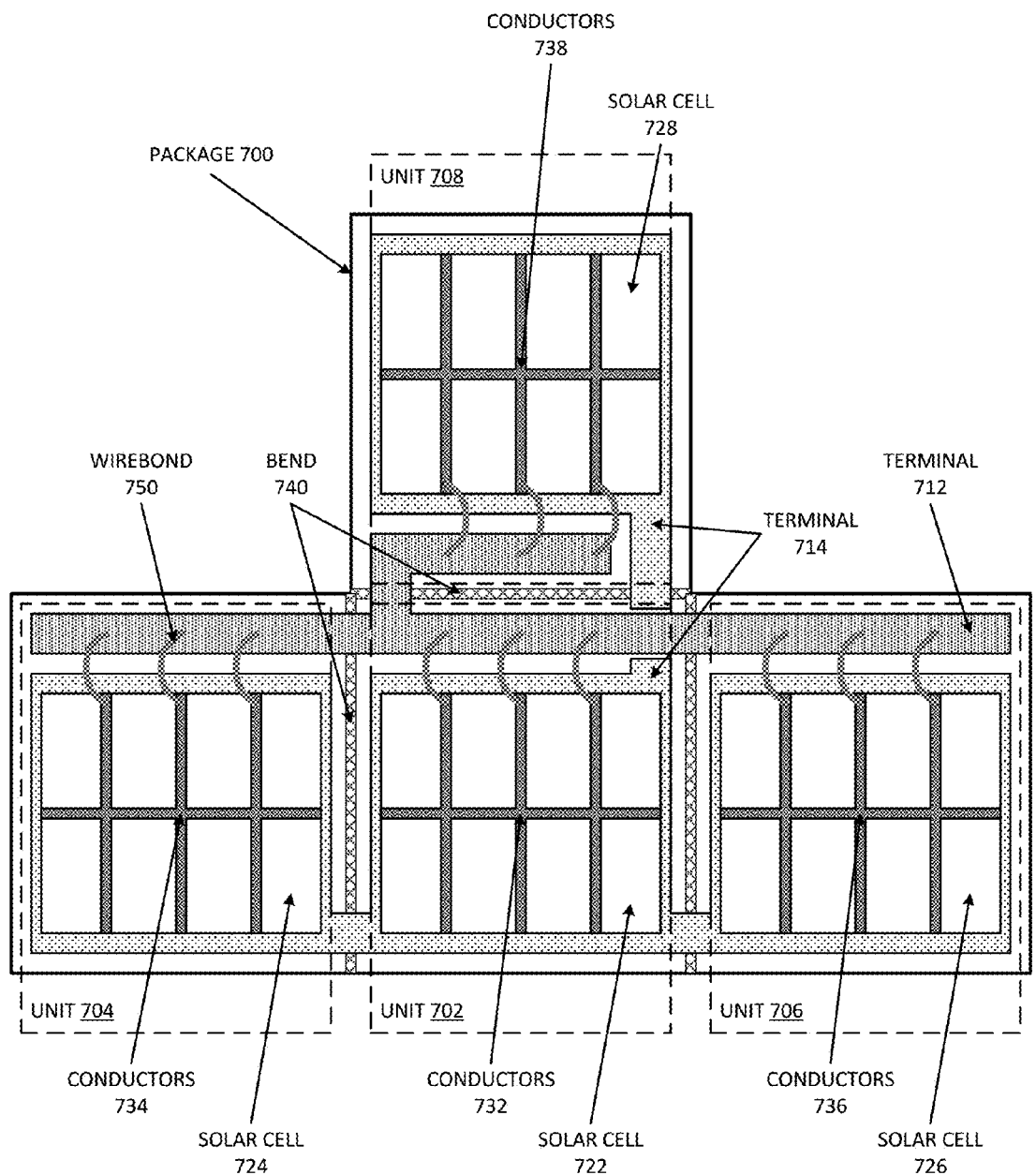
FIG. 7 is a representation of an embodiment of a top view of a four-unit solar cell package.

FIG. 7 is a representation of an embodiment of a top view of a four-unit solar cell package. Package 700 provides an example of a solar cell assembly with four portions or regions or segments, to be mounted on four different surfaces of an electronic device. In one embodiment, package 700 includes units 702, 704, 706, and 708. As illustrated, unit 702 includes solar cell 722 with conductors 732, unit 704 includes solar cell 724 with conductors 734, unit 706 includes solar cell 726 with conductors 736, and unit 708 includes solar cell 728 with conductors 738. While shown with a single solar cell per unit, in one embodiment, one or more unit 702, 704, 706, or 708 includes multiple solar cells. As illustrates, the solar cells are coupled in parallel, but could be coupled series.

In one embodiment, solar cells 722, 724, 726, and 728 couple to terminal 712 via wirebonds 750. In one embodiment, terminal 714 couples under the solar cells. Unit 702 is separated from units 704, 706, and 708 via bends 740. In one embodiment, unit 702 will mount to a top of an electronic device, and units 704, 706, and 708 will be mounted over sides of the electronic device, by bending the units down at angles to match the substrate to the surfaces of the electronic device. In one embodiment, electrical contacts for package 700 will be under unit 702. Alternatively, the electrical contacts for package 700 can be under a different solar cell unit.

Package 700 includes a bendable substrate that enables the mounting of the solar cell units to an electronic device. In one embodiment, terminal 714 includes sections of conductor, and include a trace or segment of conductor to couple the conductors under the solar cells to each other. The traces or conductors on the substrate can bend as the substrate, and still provide electrical contact. Thus, even when bent, package 700 provides electrical paths to transfer solar power generated by the solar cells.

Figure 8:
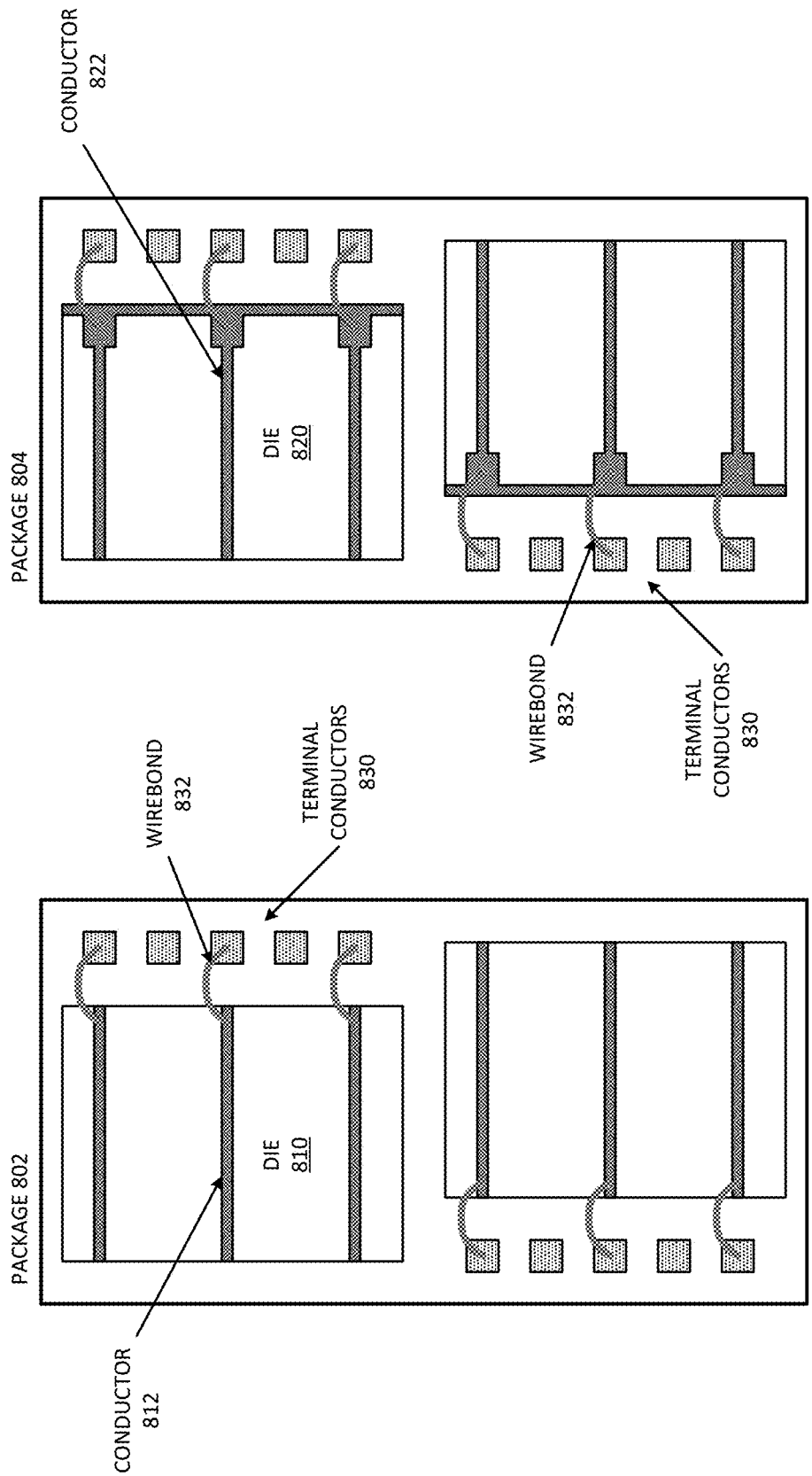
FIG. 8A-8B are representations of embodiments of top views of solar cell units with different die types.

FIG. 8A-8B are representations of embodiments of top views of solar cell units with different die types. Referring to FIG. 8A, package 802 represents at least a portion of a solar cell assembly. As illustrated, package 802 includes solar cell dies 810. For solar cell die 810, conductors 812 include strips of conductor, which may be referred to as traces. Conductors 812 provide contact areas for wirebond connections 832 to terminal conductors 830. In one embodiment, the terminals include a trace or strip of conductor on the surface of package 802. In one embodiment, the surface of package 802 includes pads as conductors 830, which can be connected in an internal layer of package 802.

Referring to FIG. 8B, package 804 represents at least a portion of a solar cell assembly. As illustrated, package 804 includes solar cell dies 820. For solar cell die 820, conductors 822 include strips of conductor with pads or wider portions at an end where wirebonds will be connected. The illustration of package 804 provides an example. Conductors 822 provide contact areas for wirebond connections 832 to terminal conductors 830. In one embodiment, the terminals include a trace or strip of conductor on the surface of package 802. In one embodiment, the surface of package 804 includes pads as conductors 830, which can be connected in an internal layer of package 804.

It will be understood that the examples of package 802 and 804 provide non-limiting examples of solar die configurations. Different solar die configurations are possible with different patterning of the conductors or different separation of the solar electronics, or both. In one embodiment, the package includes an equal number of terminal conductors as needed for the wirebond connections to the solar dies.

Figure 9:
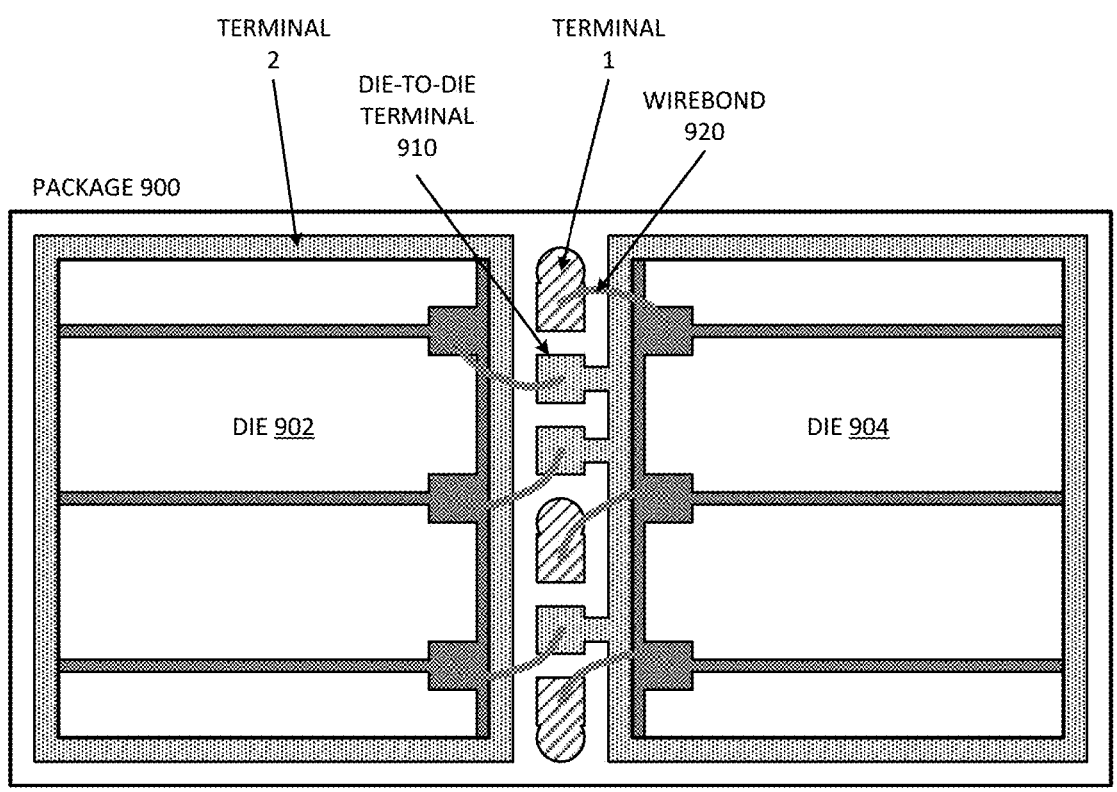
FIG. 9 is a representation of an embodiment of a top view of a series-connected solar cell package.

FIG. 9 is a representation of an embodiment of a top view of a series-connected solar cell package. Package 900 provide one example of a series-connected solar cell assembly. Package 900 provides one example of a solar cell unit to be used in accordance with any embodiment of a solar assembly that can utilize series-connected solar dies.

In one embodiment, package 900 includes die 902 and die 904. It will be observed die 902 is mounted on a backside conductor, terminal 2, and includes topside conductors to couple to the backside connector of die 904, die-to-die terminal 910. As such, terminal 910, which would be the backside terminal of die 904, becomes a die-to-die terminal to enable the frontside conductor of die 902 to couple to the backside conductor of die 904.

In one embodiment, the frontside conductor or conductors of die 904 couple to off-package terminal 1. Terminal 1 can represent a conductor that provides the power from package 900 to an electronic device, in connection with terminal 2. For example, terminals 1 and 2 can be power and ground terminals, or positive voltage and negative voltages. Thus terminals 1 and 2 provide an electrical potential between the series-connection dies. Solar dies 902 and 904 can be coupled to each other with wirebond connections 920, or other electrical connection.

Figure 10:
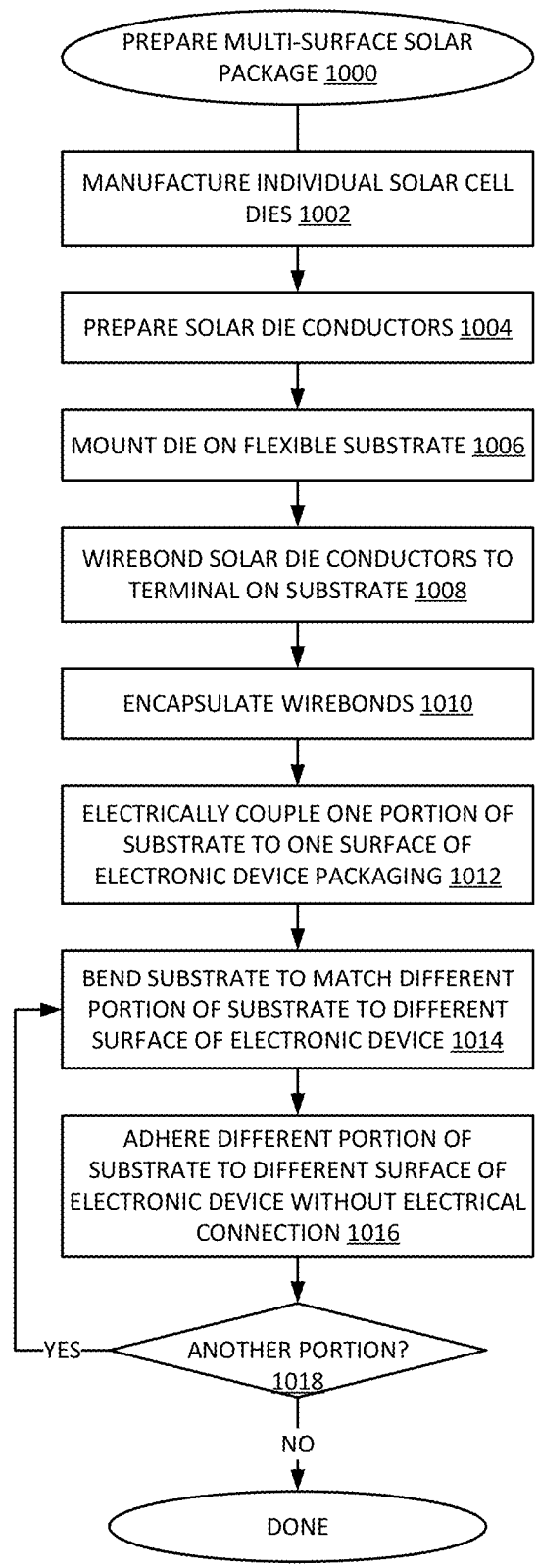
FIG. 10 is a flow diagram of an embodiment of a process for providing a multi-surface solar packaging.

FIG. 10 is a flow diagram of an embodiment of a process for providing a multi-surface solar packaging. Process 1000 for preparing a multi-surface solar cell package can be performed by a manufacturer of solar cell assemblies for mounting onto electronic devices. In one embodiment, a manufacturer manufactures individual solar cell dies, 1002. Such solar cell dies can be custom solar cell dies. In one embodiment, the manufacturer cuts individual smaller solar cell dies from a larger solar panel.

In one embodiment, the manufacturer may need to perform processing on the frontside or backside connectors of the solar cell dies to prepare them for mounting on a flexible substrate, 1004. For example, the conductors can be prepared for soldering connections, or for wirebonding, or other type of connection. In one embodiment, the preparing of the solar die conductors is part of the manufacturing of the solar cell dies. For example, the solar cell dies can be processed in a wafer, and the conductors can be processed onto the solar circuitry prior to dicing the wafers into individual solar cell dies.

The manufacturer mounts the dies on a flexible substrate, 1006. The mounting on the flexible substrate can be in accordance with any embodiment described herein. In one embodiment, process 1000 can be considered to include processing of the substrate itself, to prepare conductor patterns for mounting the solar cell dies.

In one embodiment, the manufacturer wirebonds the solar die connectors to one or more terminals on the substrate, 1008. In one embodiment, the manufacturer encapsulates the wirebonds, 1010. The encapsulation of the wirebonds can protect the connections during further processing and use of the device. The encapsulation can be in any form of electrically inert material, such as an epoxy. In one embodiment, the manufacturer electrically couples one portion of the substrate to one surface of an electronic device package, 1012. The device package can already include electronic components, or the manufacturer can prepare the device package with the solar assembly prior to including one or more electronic components, or a combination.

In one embodiment, the manufacturer bends the substrate to match a surface of the flexible substrate to which it will be mounted, 1014. The manufacturer can make sure to mount a portion of the solar cell assembly over a surface having an electrical contact. In one embodiment, the manufacturer adheres different portions of the substrate to different surfaces of the electronic device for surfaces lacking an electrical contact, 1016. In one embodiment, the solar cell assembly includes one portion or solar unit to be mounted on a surface of the electronic device, and multiple portions to be mounted on surfaces of the electronic device lacking a solar connection. Thus, in one embodiment, if there are still more portions to adhere to surfaces lacking an electrical contact, 1018 YES branch, the manufacturer mounts the other portions to respective other surfaces of the electronic device, 1014. If there are no more portions of the solar cell assembly to mount, 1018 NO branch, in one embodiment, the process ends.

Figure 11:
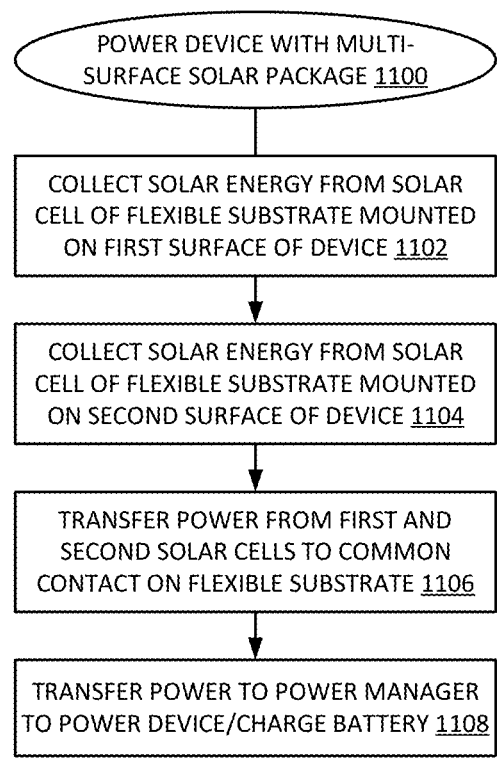
FIG. 11 is a flow diagram of an embodiment of a process for providing power with a multi-surface solar packaging.

FIG. 11 is a flow diagram of an embodiment of a process for providing power with a multi-surface solar packaging. Process 1100 for providing power from a multi-surface solar cell package can be performed by a solar cell assembly mounted on multiple surfaces of an electronic device. The solar cell assembly can include any embodiment of a solar cell assembly as referred to herein, with a portion of a solar cell assembly mounted on one surface of the electronic device, electrically coupled to the electronic device. The solar cell assembly is also mounted to another surface of the electronic device, which lacks an electrical contact.

In one embodiment, the solar cell assembly collects solar energy from one or more solar cells of a solar cell unit on a flexible substrate, which is mounted on a first surface of the device, 1102. The first surface has an electrical connection to the electronic device. The solar cell assembly also collects solar energy from a solar cell of another solar cell unit on the flexible substrate, which is mounted on a second surface of the device, 1104. While discussed separately, it will be understood that the collection of solar energy from the different surfaces can be contemporaneous. Thus, the device does not necessarily collect solar energy from the first surface only, and then the second surface only, in sequence. Sequential operation can be possible, but would not be likely to provide the best performance for the system. More commonly, all solar cells would be operational at the same time, and the system would collect whatever energy is available from all solar cells that produce power. Based on solar incidence, there may be times when the solar cell or cells on one surface will produce power while a solar cell or cells on a different surface will not produce power. The flexible substrate is mounted on multiple surfaces of the device, with bends in the substrate to position different solar cell units over different surfaces of the device. The flexible substrate conducts electricity through the bends. Thus, the flexible substrate is capable to transfer power from the first and second solar cells to a common electrical contact for the flexible substrate, 1106. There could be additional solar cell units on additional surfaces. For simplicity, only two are described with reference to process 1100.

As mentioned above, the first surface of the device includes an electrical connection. The flexible substrate electrically couples to the electrical connection via the common contact, which provides the power from the multiple solar cells to the electronic device, 1108. The solar cells can be coupled on the flexible substrate in parallel or in series, or in a combination of the two. The output voltage at the output current generated by the solar cells is provided to a power subsystem of the electronic device. In one embodiment, the power subsystem of the electronic device includes one or more regulators to regulate the solar power for use by the electronic device. In one embodiment, the flexible substrate includes one or more regulators to provide regulated power to the electronic device via the common contact.

Figure 12:
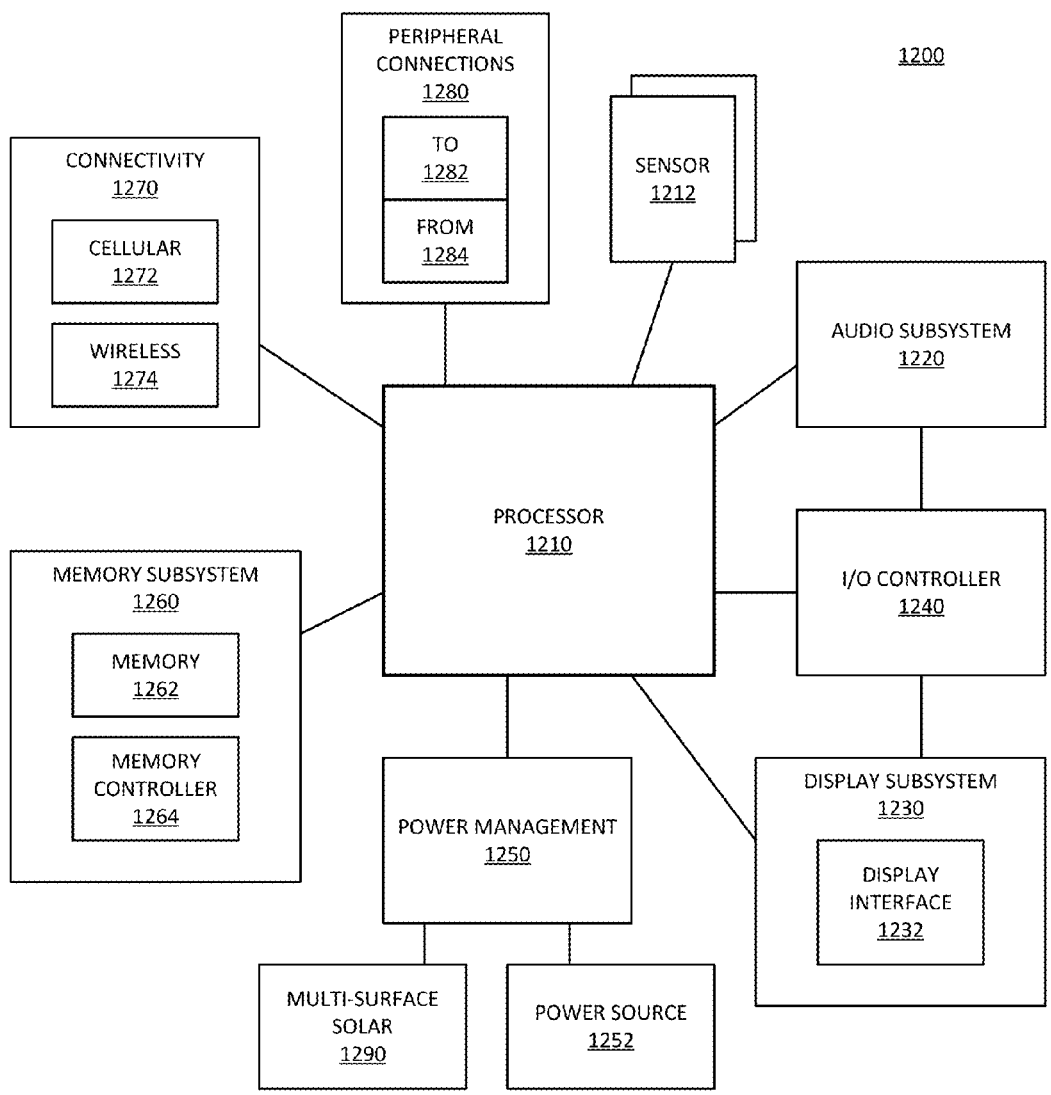
FIG. 12 is a block diagram of an embodiment of a mobile device with which a multi-surface solar package can be implemented.

FIG. 12 is a block diagram of an embodiment of a mobile device with which a multi-surface solar package can be implemented. In one embodiment, device 1200 represents a mote, internet of things (IOT) device, or other sensor devices. In one embodiment, device 1200 can represent a mobile computing device, such as a mobile phone or smartphone, wearable computing device, or other mobile device. It will be understood that certain of the components are shown generally, and not all components of such a device are shown in device 1200.

Device 1200 includes processor 1210, which performs the primary processing operations of device 1200. Processor 1210 can include one or more physical devices, such as microprocessors, application processors, microcontrollers, programmable logic devices, or other processing means. The processing operations performed by processor 1210 include the execution of an operating platform or operating system on which applications and device functions are executed. The processing operations include operations related to I/O (input/output) with a human user or with other devices, operations related to power management, operations related to connecting device 1200 to another device, or a combination. The processing operations can also include operations related to audio I/O, display I/O, or other interfacing, or a combination. Processor 1210 can execute data stored in memory. Processor 1210 can write or edit data stored in memory.

In one embodiment, system 1200 includes one or more sensors 1212. Sensors 1212 represent embedded sensors or interfaces to external sensors, or a combination. Sensors 1212 enable system 1200 to monitor or detect one or more conditions of an environment or a device in which system 1200 is implemented. Sensors 1212 can include environmental sensors (such as temperature sensors, motion detectors, light detectors, cameras, chemical sensors (e.g., carbon monoxide, carbon dioxide, or other chemical sensors)), pressure sensors, accelerometers, gyroscopes, medical or physiology sensors (e.g., biosensors, heart rate monitors, or other sensors to detect physiological attributes), or other sensors, or a combination. Sensors 1212 can also include sensors for biometric systems such as fingerprint recognition systems, face detection or recognition systems, or other systems that detect or recognize user features. Sensors 1212 should be understood broadly, and not limiting on the many different types of sensors that could be implemented with system 1200. In one embodiment, one or more sensors 1212 couples to processor 1210 via a frontend circuit integrated with processor 1210. In one embodiment, one or more sensors 1212 couples to processor 1210 via another component of system 1200.

In one embodiment, device 1200 includes audio subsystem 1220, which represents hardware (e.g., audio hardware and audio circuits) and software (e.g., drivers, codecs) components associated with providing audio functions to the computing device. Audio functions can include speaker or headphone output, as well as microphone input. Devices for such functions can be integrated into device 1200, or connected to device 1200. In one embodiment, a user interacts with device 1200 by providing audio commands that are received and processed by processor 1210.

Display subsystem 1230 represents hardware (e.g., display devices) and software components (e.g., drivers) that provide a visual display for presentation to a user. In one embodiment, the display includes tactile components or touchscreen elements for a user to interact with the computing device. Display subsystem 1230 includes display interface 1232, which includes the particular screen or hardware device used to provide a display to a user. In one embodiment, display interface 1232 includes logic separate from processor 1210 (such as a graphics processor) to perform at least some processing related to the display. In one embodiment, display subsystem 1230 includes a touchscreen device that provides both output and input to a user. In one embodiment, display subsystem 1230 includes a high definition (HD) display that provides an output to a user. High definition can refer to a display having a pixel density of approximately 100 PPI (pixels per inch) or greater, and can include formats such as full HD (e.g., 1080p), retina displays, 4K (ultra high definition or UHD), or others. In one embodiment, display subsystem 1230 generates display information based on data stored in memory and operations executed by processor 1210.

I/O controller 1240 represents hardware devices and software components related to interaction with a user. I/O controller 1240 can operate to manage hardware that is part of audio subsystem 1220, or display subsystem 1230, or both. Additionally, I/O controller 1240 illustrates a connection point for additional devices that connect to device 1200 through which a user might interact with the system. For example, devices that can be attached to device 1200 might include microphone devices, speaker or stereo systems, video systems or other display device, keyboard or keypad devices, or other I/O devices for use with specific applications such as card readers or other devices.

As mentioned above, I/O controller 1240 can interact with audio subsystem 1220 or display subsystem 1230 or both. For example, input through a microphone or other audio device can provide input or commands for one or more applications or functions of device 1200. Additionally, audio output can be provided instead of or in addition to display output. In another example, if display subsystem includes a touchscreen, the display device also acts as an input device, which can be at least partially managed by I/O controller 1240. There can also be additional buttons or switches on device 1200 to provide I/O functions managed by I/O controller 1240.

In one embodiment, I/O controller 1240 manages devices such as accelerometers, cameras, light sensors or other environmental sensors, gyroscopes, global positioning system (GPS), or other hardware that can be included in device 1200, or sensors 1212. The input can be part of direct user interaction, as well as providing environmental input to the system to influence its operations (such as filtering for noise, adjusting displays for brightness detection, applying a flash for a camera, or other features).

In one embodiment, device 1200 includes power management 1250 that manages battery power usage, charging of the battery, and features related to power saving operation. Power management 1250 manages power from power source 1252, which provides power to the components of system 1200. In one embodiment, power source 1252 includes an AC to DC (alternating current to direct current) adapter to plug into a wall outlet. Such AC power can be renewable energy (e.g., solar power, motion based power). In one embodiment, power source 1252 includes only DC power, which can be provided by a DC power source, such as an external AC to DC converter. In one embodiment, power source 1252 includes wireless charging hardware to charge via proximity to a charging field. In one embodiment, power source 1252 can include an internal battery or fuel cell source.

Memory subsystem 1260 includes memory device(s) 1262 for storing information in device 1200. Memory subsystem 1260 can include nonvolatile (state does not change if power to the memory device is interrupted) or volatile (state is indeterminate if power to the memory device is interrupted) memory devices, or a combination. Memory 1260 can store application data, user data, music, photos, documents, or other data, as well as system data (whether long-term or temporary) related to the execution of the applications and functions of system 1200. In one embodiment, memory subsystem 1260 includes memory controller 1264 (which could also be considered part of the control of system 1200, and could potentially be considered part of processor 1210). Memory controller 1264 includes a scheduler to generate and issue commands to memory device 1262.

Connectivity 1270 includes hardware devices (e.g., wireless or wired connectors and communication hardware, or a combination of wired and wireless hardware) and software components (e.g., drivers, protocol stacks) to enable device 1200 to communicate with external devices. The external device could be separate devices, such as other computing devices, wireless access points or base stations, as well as peripherals such as headsets, printers, or other devices. In one embodiment, system 1200 exchanges data with an external device for storage in memory or for display on a display device. The exchanged data can include data to be stored in memory, or data already stored in memory, to read, write, or edit data.

Connectivity 1270 can include multiple different types of connectivity. To generalize, device 1200 is illustrated with cellular connectivity 1272 and wireless connectivity 1274. Cellular connectivity 1272 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 1274 refers to wireless connectivity that is not cellular, and can include personal area networks (such as Bluetooth), local area networks (such as WiFi), or wide area networks (such as WiMax), or other wireless communication, or a combination. Wireless communication refers to transfer of data through the use of modulated electromagnetic radiation through a non-solid medium. Wired communication occurs through a solid communication medium.

Peripheral connections 1280 include hardware interfaces and connectors, as well as software components (e.g., drivers, protocol stacks) to make peripheral connections. It will be understood that device 1200 could both be a peripheral device ("to" 1282) to other computing devices, as well as have peripheral devices ("from" 1284) connected to it. Device 1200 commonly has a "docking" connector to connect to other computing devices for purposes such as managing (e.g., downloading, uploading, changing, synchronizing) content on device 1200. Additionally, a docking connector can allow device 1200 to connect to certain peripherals that allow device 1200 to control content output, for example, to audiovisual or other systems.

In addition to a proprietary docking connector or other proprietary connection hardware, device 1200 can make peripheral connections 1280 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

In one embodiment, system 1200 includes multi-surface solar 1290, which represents a solar assembly in accordance with any embodiment described herein, which includes a flexible substrate to mount to multiple surfaces of a device housing or packaging of system 1200. Multi-surface solar 1290 includes one or more solar cells mounted on each of multiple portions of the flexible substrate. The portions can be separated by bends that allow the flexible substrate to conform to a bend in the device housing, and enable the mounting of the solar assembly onto multiple surfaces of the device. The solar assembly can thus provide solar power to system 1200 in accordance with any embodiment described herein.

In one aspect, an electronic device to collect solar energy includes: device packaging including a first surface that includes an electrical contact for solar power, and a second surface that lacks an electrical contact for the solar power, wherein the first surface and the second surface intersect at an angle; and a solar cell package with a foldable substrate, wherein the solar cell package to mount on the first surface and electrically couple to the electrical contact, and to mount on the second surface, to position at least one solar cell over the first surface and at least one solar cell over the second surface.

In one embodiment, the first surface and the second surface intersect at an angle between approximately 30 degrees and 150 degrees. In one embodiment, the first surface and the second surface intersect at an angle of approximately 90 degrees. In one embodiment, the device packaging further including a third surface to intersect with the first surface at an angle, the third surface lacking an electrical contact for the solar power. In one embodiment, the device packaging further including a third surface to intersect with the second surface at an angle, the third surface lacking an electrical contact for the solar power. In one embodiment, the solar cell package to mount multiple solar cells over the first surface. In one embodiment, the solar cell package includes an electrical trace on the foldable substrate to enable the solar cells to couple in parallel. In one embodiment, the solar cell package includes an electrical trace on the foldable substrate to enable the solar cells to couple in series. In one embodiment, the solar cell package includes four solar cell units to mount to four different surfaces of the device packaging. In one embodiment, further comprising: a microprocessor to be housed within the device packaging; and a sensor to be housed within the device packaging; wherein the solar cell package to provide power for the microprocessor and the sensor to execute. In one embodiment, further comprising: a battery to be housed within the device packaging, wherein the solar cell package is to charge the battery. In one embodiment, the first solar cell unit including multiple solar cells, or the second solar cell unit including multiple solar cells, or both the first and second solar cell units including multiple solar cells.

In one aspect, a solar cell assembly includes: a bendable substrate capable to bend at an angle and conduct electrical charge through the bend, the bendable substrate to mount to a first surface and a second surface of an electronic device, wherein the first and second surfaces are to intersect at an angle; a first solar cell unit on the bendable substrate to mount over the first surface; and a second solar cell unit on the bendable substrate to mount over the second surface; wherein the bendable substrate includes an electrical connector to couple to an electrical contact on the first surface, and lacks an electrical connector to couple to the second surface.

In one embodiment, the first surface and the second surface intersect at an angle between approximately 30 degrees and 150 degrees. In one embodiment, the first surface and the second surface are to intersect at an angle of approximately 90 degrees. In one embodiment, further comprising a third solar cell unit on the bendable substrate to mount over a third surface of the electronic device, wherein the third bendable substrate lacks an electrical connector to couple to the third surface. In one embodiment, the third surface is to intersect with the first surface at an angle, the third surface lacking an electrical contact for the solar power. In one embodiment, the third surface is to intersect with the second surface at an angle, the third surface lacking an electrical contact for the solar power. In one embodiment, the first solar cell unit including multiple solar cells. In one embodiment, the second solar cell unit including multiple solar cells. In one embodiment, the bendable substrate includes an electrical trace to enable the first solar cell unit and the second solar cell unit to couple in parallel. In one embodiment, the bendable substrate includes an electrical trace to enable the first solar cell unit and the second solar cell unit to couple in series. In one embodiment, the bendable substrate includes four regions to be separated by bends in the substrate, and the four regions each including a solar cell unit to mount over a separate surface of the electronic device, with a single surface including an electrical contact to couple to the electronical connector of the bendable substrate. In one embodiment, the first solar cell unit including multiple solar cells, or the second solar cell unit including multiple solar cells, or both the first and second solar cell units including multiple solar cells.

In one aspect, a method for powering an electronic device, comprising: collecting solar energy from a first solar cell mounted on a bendable substrate over a first surface of an electronic device; collecting solar energy from a second solar cell mounted on the bendable substrate over a second surface of the electronic device; and transferring the solar energy from the first and second solar cells via the bendable substrate to an electrical contact of the first surface of the electronic device, wherein the second surface of the electronic device lacks an electrical contact.

In one embodiment, transferring the solar energy comprises transferring the solar energy from parallel-connected first and second solar cells. In one embodiment, transferring the solar energy comprises transferring the solar energy from series-connected first and second solar cells. In one embodiment, further comprising collecting solar energy from a third solar cell mounted on the bendable substrate over a third surface of the electronic device; wherein transferring the solar energy includes transferring the solar energy from the third solar cell to the electrical contact of the first surface of the electronic device, wherein the third surface of the electronic device lacks an electrical contact. In one embodiment, the third surface is to intersect with the first surface at an angle, the third surface lacking an electrical contact for the solar power. In one embodiment, the third surface is to intersect with the second surface at an angle, the third surface lacking an electrical contact for the solar power. In one embodiment, further comprising collecting solar energy from a fourth solar cell mounted on the bendable substrate over a fourth surface of the electronic device; wherein transferring the solar energy includes transferring the solar energy from the fourth solar cell to the electrical contact of the first surface of the electronic device, wherein the fourth surface of the electronic device lacks an electrical contact. In one embodiment, the first surface and the second surface intersect at an angle between approximately 30 degrees and 150 degrees. In one embodiment, the first surface and the second surface are to intersect at an angle of approximately 90 degrees. In one embodiment, the first solar cell unit including multiple solar cells. In one embodiment, the second solar cell unit including multiple solar cells. In one embodiment, the first solar cell unit including multiple solar cells, or the second solar cell unit including multiple solar cells, or both the first and second solar cell units including multiple solar cells. In one aspect, an apparatus comprising means for performing operations to execute a method for powering an electronic device in accordance with any embodiment of the method.

Flow diagrams as illustrated herein provide examples of sequences of various process actions. The flow diagrams can indicate operations to be executed by a software or firmware routine, as well as physical operations. In one embodiment, a flow diagram can illustrate the state of a finite state machine (FSM), which can be implemented in hardware, software, or a combination. Although shown in a particular sequence or order, unless otherwise specified, the order of the actions can be modified. Thus, the illustrated embodiments should be understood only as an example, and the process can be performed in a different order, and some actions can be performed in parallel. Additionally, one or more actions can be omitted in various embodiments; thus, not all actions are required in every embodiment. Other process flows are possible.

To the extent various operations or functions are described herein, they can be described or defined as software code, instructions, configuration, data, or a combination. The content can be directly executable ("object" or "executable" form), source code, or difference code ("delta" or "patch" code). The software content of the embodiments described herein can be provided via an article of manufacture with the content stored thereon, or via a method of operating a communication interface to send data via the communication interface. A machine readable storage medium can cause a machine to perform the functions or operations described, and includes any mechanism that stores information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). A communication interface includes any mechanism that interfaces to any of a hardwired, wireless, optical, etc., medium to communicate to another device, such as a memory bus interface, a processor bus interface, an Internet connection, a disk controller, etc. The communication interface can be configured by providing configuration parameters or sending signals, or both, to prepare the communication interface to provide a data signal describing the software content. The communication interface can be accessed via one or more commands or signals sent to the communication interface.

Various components described herein can be a means for performing the operations or functions described. Each component described herein includes software, hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc.

Besides what is described herein, various modifications can be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. An electronic device, comprising:
   device packaging including
      a first surface that includes an electrical contact to receive solar power from a mounted solar cell, and
      a second surface that lacks an electrical contact to receive solar power from a mounted solar cell, wherein the first surface and the second surface intersect at an angle; and
   a solar cell package with a foldable substrate, wherein the solar cell package to physically mount on the first surface and to physically mount on the second surface, to position at least one solar cell over the first surface and at least one solar cell over the second surface, where both the solar cell over the first surface and the solar cell over the second surface are to electrically couple to the electrical contact of the first surface.

2. The electronic device of claim 1, wherein the first surface and the second surface intersect at an angle between approximately 30 degrees and 150 degrees.

3. The electronic device of claim 2, wherein the first surface and the second surface intersect at an angle of approximately 90 degrees.

4. The electronic device of claim 1, wherein the device packaging further including
a third surface to intersect with the first surface at an angle, the third surface lacking an electrical contact for the solar power.

5. The electronic device of claim 1, wherein the device packaging further including
a third surface to intersect with the second surface at an angle, the third surface lacking an electrical contact for the solar power.

6. The electronic device of claim 1, wherein the solar cell package to mount multiple solar cells over the first surface.

7. The electronic device of claim 1, wherein the solar cell package includes an electrical trace on the foldable substrate to enable the solar cells to couple in parallel.

8. The electronic device of claim 1, wherein the solar cell package includes an electrical trace on the foldable substrate to enable the solar cells to couple in series.

9. The electronic device of claim 1, wherein the solar cell package includes four solar cell units to mount to four different surfaces of the device packaging.

10. The electronic device of claim 1, further comprising:
a microprocessor to be housed within the device packaging; and
a sensor to be housed within the device packaging;
wherein the solar cell package to provide power for the microprocessor and the sensor to execute.

11. The electronic device of claim 1, further comprising:
a battery to be housed within the device packaging, wherein the solar cell package is to charge the battery.

12. A solar cell assembly, comprising:
a bendable substrate capable to bend at an angle and conduct electrical charge through the bend, the bendable substrate to mount to a first surface and a second surface of an electronic device, wherein the first and second surfaces are to intersect at an angle;
a first solar cell unit on the bendable substrate to physically mount on the first surface; and
a second solar cell unit on the bendable substrate to physically mount on the second surface;
wherein the bendable substrate includes an electrical connector to couple to an electrical contact on the first surface, and lacks an electrical connector to couple to the second surface, wherein both the first and second solar cells are to electrically couple to the electrical contact of the first surface.

13. The solar cell assembly of claim 12, wherein the first surface and the second surface are to intersect at an angle of approximately 90 degrees.

14. The solar cell assembly of claim 12, further comprising
a third solar cell unit on the bendable substrate to mount over a third surface of the electronic device, the bendable substrate lacks an electrical connector to couple to the third surface.

15. The solar cell assembly of claim 12, wherein the first solar cell unit including multiple solar cells.

16. The solar cell assembly of claim 12, wherein the second solar cell unit including multiple solar cells.

17. The solar cell assembly of claim 12, wherein the bendable substrate includes an electrical trace to enable the first solar cell unit and the second solar cell unit to couple in parallel.

18. The solar cell assembly of claim 12, wherein the bendable substrate includes an electrical trace to enable the first solar cell unit and the second solar cell unit to couple in series.

19. The solar cell assembly of claim 12, wherein the bendable substrate includes four regions to be separated by bends in the substrate, and the four regions each including a solar cell unit to mount over a separate surface of the electronic device, with a single surface including an electrical contact to couple to the electrical connector of the bendable substrate.

20. A method, comprising:
collecting solar energy from a first solar cell mounted on a bendable substrate over a first surface of an electronic device, the bendable substrate to physically mount to the first surface;
collecting solar energy from a second solar cell mounted on the bendable substrate over a second surface of the electronic device, the bendable substrate to physically mount to the second surface; and
transferring the solar energy from the first and second solar cells via the bendable substrate to an electrical contact of the first surface of the electronic device, wherein the second surface of the electronic device lacks an electrical contact.

21. The method of claim 20, wherein transferring the solar energy comprises transferring the solar energy from parallel-connected first and second solar cells.

22. The method of claim 20, wherein transferring the solar energy comprises transferring the solar energy from series-connected first and second solar cells.

23. The method of claim 20, further comprising
collecting solar energy from a third solar cell mounted on the bendable substrate over a third surface of the electronic device;
wherein transferring the solar energy includes transferring the solar energy from the third solar cell to the electrical contact of the first surface of the electronic device, wherein the third surface of the electronic device lacks an electrical contact.

* * * * *